United States Patent
Wang et al.

[19]

[11] Patent Number: 6,054,384
[45] Date of Patent: Apr. 25, 2000

[54] USE OF HARD MASKS DURING ETCHING OF OPENINGS IN INTEGRATED CIRCUITS FOR HIGH ETCH SELECTIVITY

[75] Inventors: Fei Wang, San Jose; Susan Chen, Sunnyvale, both of Calif.

[73] Assignee: Advanced Micro Devices, Inc., Sunnyvale, Calif.

[21] Appl. No.: 09/081,196

[22] Filed: May 19, 1998

[51] Int. Cl.[7] .............................................. H01L 21/4763
[52] U.S. Cl. .......................... 438/637; 438/700; 438/640; 216/47
[58] Field of Search .................... 438/700, 637, 438/638, 639, 640; 216/47

[56] References Cited

U.S. PATENT DOCUMENTS

| | | | |
|---|---|---|---|
| 4,832,789 | 5/1989 | Cochran et al. | 156/644 |
| 4,902,377 | 2/1990 | Berglund et al. | 156/643 |
| 5,110,712 | 5/1992 | Kessler et al. | 430/312 |
| 5,126,231 | 6/1992 | Levy | 430/313 |
| 5,591,675 | 1/1997 | Kim et al. | 437/195 |
| 5,639,345 | 6/1997 | Huang et al. | 156/657 |
| 5,891,799 | 4/1999 | Tsui | 438/624 |
| 5,933,761 | 8/1999 | Lee | 438/783 |
| 5,935,762 | 8/1999 | Dai et al. | 430/312 |

OTHER PUBLICATIONS

Wolf Stanley and Tauber Richard N. "Silicon Processing For The VLSI Era Vol. 1—Process Technology", pp. 531–534, 1986.

Primary Examiner—Matthew Smith
Assistant Examiner—Renzo Rocchegiani
Attorney, Agent, or Firm—Monica H. Choi

[57] ABSTRACT

With the present invention, a plurality of contiguous openings within an integrated circuit are etched with high etch selectivity. The present invention includes the step of depositing a first masking layer adjacent a first opening layer. The first masking layer has a first pattern for defining a first opening in the first opening layer. The present invention also includes the step of depositing a second opening layer adjacent the first masking layer. Additionally, the present invention includes the step of depositing a second masking layer, that is comprised of a hard mask material, adjacent the second insulating layer. The second masking layer has a second pattern for defining a second opening in the second opening layer. The second pattern is aligned with the first pattern such that the first opening and the second opening are contiguous. With the second masking layer being comprised of a hard mask material, at least one of the first opening and the second opening is readily etched with an high selectivity etch process, such as a high temperature etch and/or a high polymer etch. With high etch selectivity, the present invention is especially amenable for small-geometry integrated circuit fabrication. Moreover, the present invention may be practiced to particular advantage during a dual damascene etch for a via hole and a trench line in integrated circuit metallization.

8 Claims, 5 Drawing Sheets

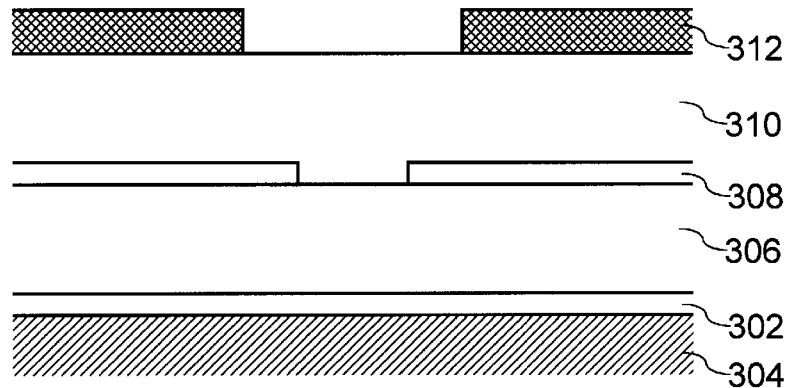
FIG. 3A
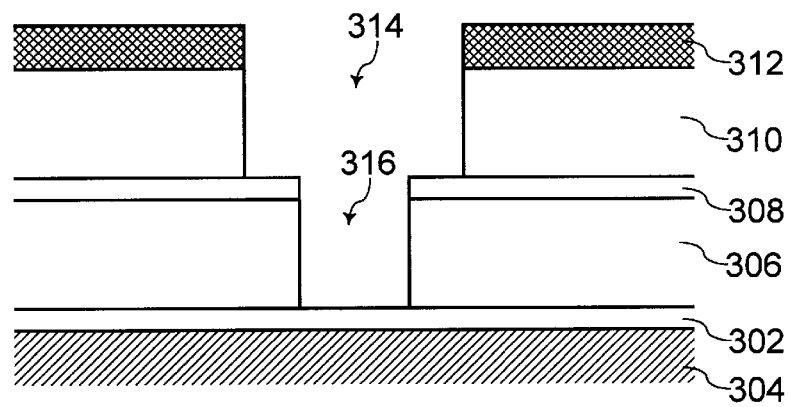
FIG. 3B
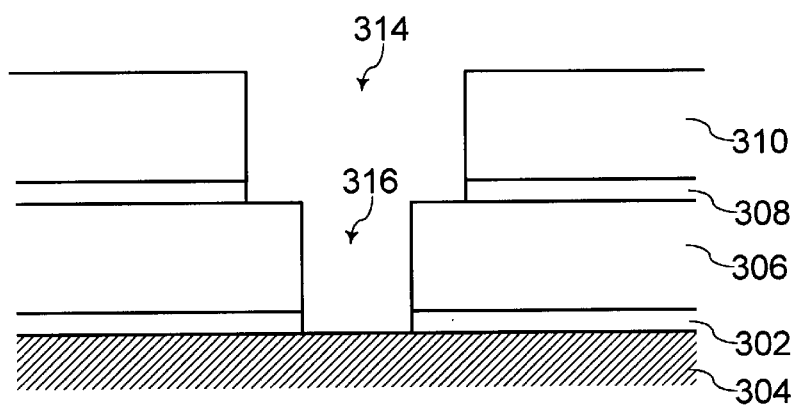
FIG. 3C
FIG 3 (PRIOR ART)

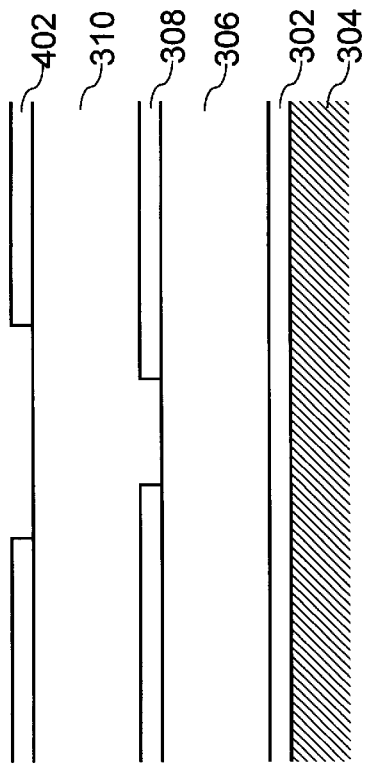
FIG. 4B
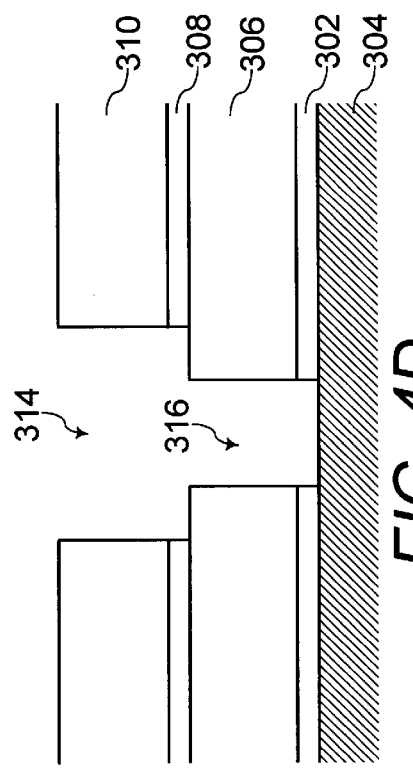
FIG. 4D
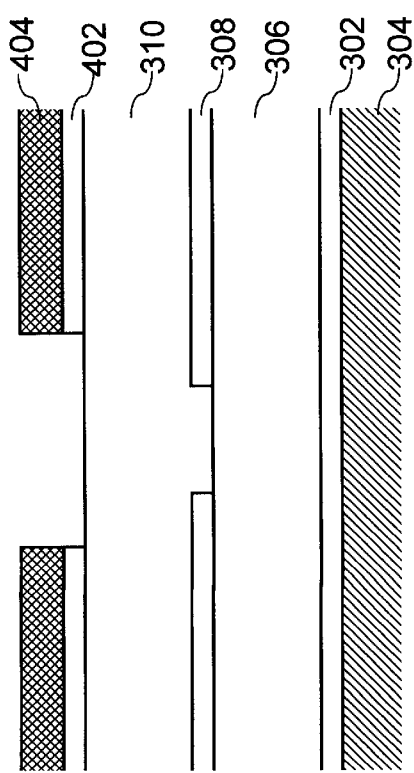
FIG. 4A
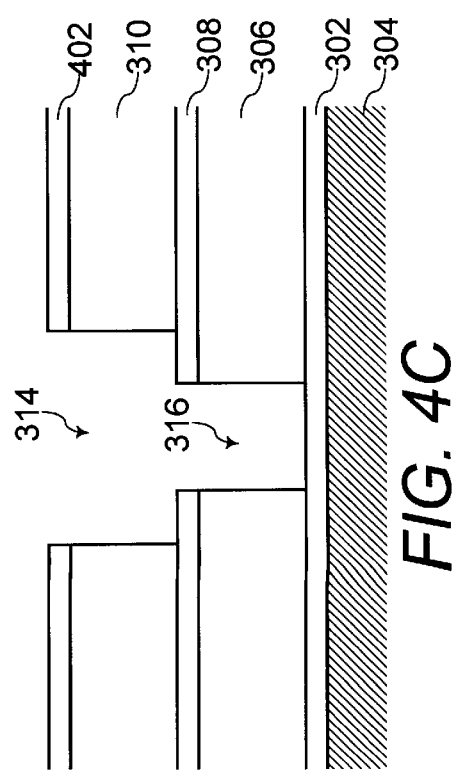
FIG. 4C
FIG 4

USE OF HARD MASKS DURING ETCHING OF OPENINGS IN INTEGRATED CIRCUITS FOR HIGH ETCH SELECTIVITY

TECHNICAL FIELD

This invention relates to etching processes for integrated circuit fabrication, and more particularly, to a method for etching an integrated circuit using hard masks within the integrated circuit for high etch selectivity.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield during IC fabrication. Such advantages are a driving force to constantly scale down IC dimensions.

With the scaling down of integrated circuit dimensions, openings, which are etched within the integrated circuit, are reduced in size. The aspect ratio of the opening, which is defined as the ratio of the width of the opening to the depth of the opening, increases with scaling down of integrated circuit dimensions.

Etch selectivity refers to how closely a desired etched area has been etched out during an etch process. The desired etched area is defined by a masking layer over the area to be etched. Depending on the etch process, the actual etched area may deviate from the desired etched area. An etch process having a high (i.e., good) etch selectivity results in an opening having an area that is substantially close to the desired etched area. An etch process having a low (i.e., poor) etch selectivity results in an opening having an area that substantially deviates from the desired etched area.

When etching openings with high aspect ratios, the etch selectivity becomes especially critical for controlling the location and shape of small-geometry integrated circuit dimensions. Thus, an etch process which is amenable for high etch selectivity is especially important for small-geometry integrated circuit fabrication.

The present invention is described with a dual damascene etch process for etching out a trench line and a via hole for integrated circuit metallization. However, as would be apparent to one of ordinary skill in the art, the present invention may be applied to etching any other type of openings within an integrated circuit.

As an integrated circuit is scaled down, metallization, which interconnects devices on the integrated circuit, is also scaled down. Metal lines for scaled-down integrated circuits are fabricated using a damascene etch process. In such a process, a trench line is etched within an insulating layer. That trench line is then filled with metal or any other conductive material. The surface of the integrated circuit is then polished to form conductive lines with the conductive material contained within the trench lines.

Referring to FIG. 1, integrated circuits typically include multi-level metallization. A first metal line 102 is contained within a first trench line 104 etched in a first trench insulating layer 106. A second metal line 108 is contained within a second trench line 110 etched in a second trench insulating layer 112. The first metal line 102 is on a first metallization level on the integrated circuit, and the second metal line 108 is on a second metallization level on the integrated circuit. A via interconnects the metal lines 102 and 108 on the two different metallization levels. A via plug 114 is comprised of a conductive material and is disposed within a via hole 116 etched in a via insulating layer 118. The insulating layers 106, 112, and 118 are comprised of any insulating material such as any form of oxides as is known to one of ordinary skill in the art.

Referring to FIG. 2, if the second trench line 110 and the via hole 116 were not filled with a conductive material, a top view of the integrated circuit of FIG. 1 shows the second trench line 110 running over the via hole 116. The first metal line 102 is disposed on the bottom of the via hole 116. FIG. 1 is a cross-sectional view of the integrated circuit of FIG. 2 along line AA after the via hole 116 and the second trench line 110 have been filled with a conductive material.

A dual damascene etch refers to an etching process whereby a via hole and a trench line are etched away with one etching step or a series of etching steps. Referring to FIG. 3A (which shows a cross-section along line AA of the integrated circuit of FIG. 2), a prior art dual damascene etch process includes a step of depositing a bottom nitride layer 302 adjacent a first metal layer 304. A via insulating layer 306 is deposited adjacent the bottom nitride layer 302.

A via masking layer 308 is deposited adjacent the via insulating layer 306. The via masking layer 308 is etched to have a via pattern for defining a via hole in the via insulating layer 306. The via masking layer typically is comprised of a hard mask material such as nitride or any other type of dielectric material which is known to one of ordinary skill in the art to be an etch-stop material.

A trench insulating layer 310 is deposited adjacent the via masking layer 308. Then, a photoresist layer 312 is deposited adjacent the trench insulating layer 310. The photoresist layer 312 is further processed to have a trench pattern for defining a trench line in the trench insulating layer 310. The via pattern in the via masking layer and the trench pattern in the photoresist layer are aligned such that a first conductive material filled within the via hole forms a conductive path with a second conductive material filled within the trench line, as illustrated in FIGS. 1 and 2.

Referring to FIG. 3B, a trench line 314 is etched out of the trench insulating layer 310 with the photoresist layer 312 defining the size, shape, and location of the trench line 314. Furthermore, in a dual damascene etch process, a via hole 316 is also etched out of the via insulating layer 306. Referring to FIG. 3A, the trench insulating layer 310 abuts the via insulating layer 306. Thus, using a dual damascene etch process, the trench line 314 and the via hole 316 are etched with one etching step, and the trench line 314 and the via hole 316 are contiguous openings.

Referring to FIG. 3C, any part of the masking layers 302 and 308 (and the nitride layer 302) that are exposed are etched away. Then, the via hole 316 and the trench line 314 are filled with conductive material. The conductive material in the via hole 316 forms a conductive path between the first metal layer 304 and the conductive material in the trench line 314.

With the prior art etch process of FIG. 3, because a photoresist layer 312 is used to define the trench line, a high temperature etch cannot be used since high temperatures lead to reflow of the photoresist layer 312. Thus, with the photoresist layer 312 being the top layer during the etch process, a temperature in the range of 0° C. to 20° C. is typically used in the prior art. However, as known to one of ordinary skill in the art of IC fabrication, an etch using a lower temperature is disadvantageous with lower etch selectivity.

Furthermore, with the use of the photoresist layer 312 being the top layer, a high polymer etch does not readily etch down to the bottom of the via hole 316. The photoresist layer 312 adds extra depth to the openings 314 and 316 to be etched. Furthermore, a high polymer etch tends to deposit polymer as a by-product of the etch These factors lead to deposit of polymer within the via hole 316 resulting in an etch-stop before the via hole 316 is completely etched out. However, as known to one of ordinary skill in the art of IC fabrication, a high polymer etch also results in high etch selectivity and would be desirable for small-geometry integrated circuit fabrication.

Thus, an etch process which allows etching openings in an integrated circuit using a high temperature etch and/or a high polymer etch would be desirable for high etch selectivity. Such high etch selectivity is especially advantageous for small-geometry integrated circuit fabrication.

SUMMARY OF THE INVENTION

Accordingly, the present invention is a method for etching a plurality of contiguous openings within an integrated circuit with high etch selectivity.

Generally, the present invention includes a step of depositing a first masking layer adjacent a first opening layer. The first masking layer has a first pattern for defining a first opening in the first opening layer. Furthermore the present invention includes a step of depositing a second opening layer adjacent the first masking layer. Also, the present invention includes a step of depositing a second masking layer adjacent the second opening layer. The second masking layer has a second pattern for defining a second opening in the second opening layer. The second pattern is aligned with the first pattern such that the first opening and the second opening are contiguous. Importantly, the second masking layer is comprised of hard mask material. Then, at least one of the first opening and the second opening is etched with at least one of a high temperature etch and a high polymer etch, for high etch selectivity. Thus, the present invention is especially amenable for small-geometry integrated circuit fabrication.

The present invention may be used to particular advantage for etching a via hole and a trench line within an integrated circuit during a dual damascene etch. In that case, the present invention includes the step of depositing a via masking layer adjacent a via insulating layer. The via masking layer has a via pattern for defining the via hole in the via insulating layer. Also, the present invention includes the step of depositing a trench insulating layer adjacent the via masking layer. Furthermore, a trench masking layer is deposited adjacent the trench insulating layer. The trench masking layer has a trench pattern for defining the trench line in the trench insulating layer. The trench pattern is aligned with the via pattern such that a first conductive material filled within the via hole forms a conductive path with a second conductive material filled within the trench line. In the present invention, the trench masking layer is comprised of hard mask material.

The present invention may be used to particular advantage when the hard mask material of the trench masking layer is comprised of nitride, titanium nitride, or titanium. The trench line and via hole are then etched using etching processes, such as a high temperature etch or a high polymer etch, that are especially amenable for high etch selectivity. Thus, the present invention is particularly amenable for fine line metallization.

Then, any exposed part of the via masking layer and the trench masking layer is removed before the via hole and the trench line are filled with conductive material.

These and other features and advantages of the present invention will be better understood by considering the following detailed description of the invention which is presented with the attached drawings.

BRIEF DESCRIPTION OF THE DRAWINGS

FIG. 3, including FIGS. 3A, 3B, and 3C, shows cross-sectional views depicting the steps of a dual damascene etch for etching a trench line and a via hole, according to the prior art;

FIG. 4, including FIGS. 4A, 4B, 4C, and 4D, shows cross-sectional views depicting the steps of a dual damascene etch for etching a trench line and a via hole, according to the present invention;

FIGS. 5A, 5B, 5C, and 5D, shows cross-sectional views depicting the steps of a dual damascene etch for etching a trench line and a via hole, according to an alternative embodiment of the present invention; FIGS. 6A, 6B, 6C, and 6D, shows cross-sectional views depicting the steps of a dual damascene etch for etching a trench line and a via hole, according to another embodiment of the present invention.

Figure 1:
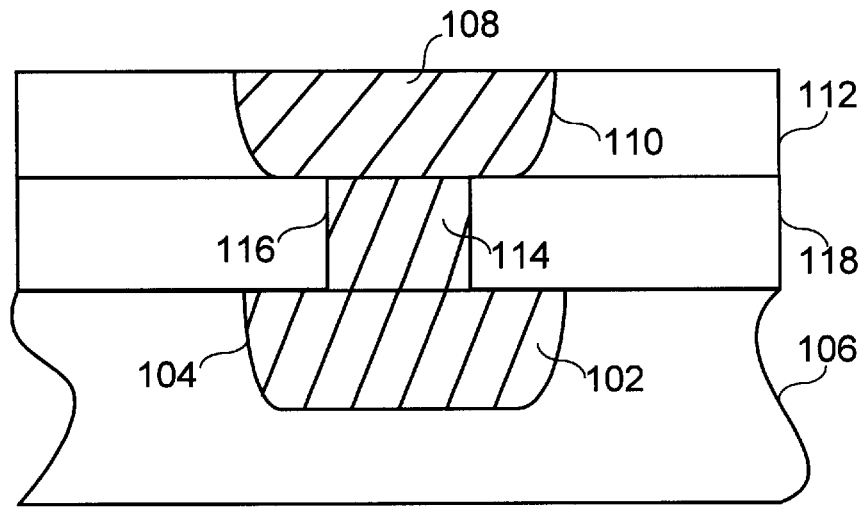
FIG. 1 shows a cross-section of multi-level metallization in an integrated circuit including a via for interconnecting metal lines on different levels.

The figures referred to herein are drawn for clarity of illustration and are not necessarily drawn to scale. Moreover, the figures referred to herein focus on a metallization structure within a larger integrated circuit. Elements having the same reference numeral in FIGS. 1–6 refer to elements having similar structure and function.

DETAILED DESCRIPTION

The present invention is described with a dual damascene etch process for etching out a trench line and a via hole for integrated circuit metallization. However, the present invention may be practiced to etch any other type of contiguous openings within an integrated circuit by one of ordinary skill in the art from the description herein.

Referring to FIG. 4A (with same reference numerals as FIG. 3 for elements having similar structure and function), a trench masking layer 402 comprised of a hard mask material is added. The trench masking layer 402 is deposited adjacent the trench insulating layer 310. The trench masking layer has the trench pattern for defining the trench line 314. The trench pattern is etched into the trench masking layer using a photoresist layer 404, as is known to one of ordinary skill in the art of integrated circuit fabrication.

Before the dual damascene etch for etching the via hole 316 and the trench line 314, the photoresist layer 404 is removed as shown in FIG. 4B. Referring to FIG. 4B, the trench masking layer 402 is comprised of hard mask material such as nitride, titanium nitride, titanium, or any other material that is amenable for use in high temperature etch or a high polymer etch as known to one of ordinary skill in the art of integrated circuit fabrication. The via masking layer 308 is typically comprised of nitride or any other type of dielectric material which is known to one of ordinary skill in the art to be an etch-stop material. Then, during the dual damascene etch, a high selectivity etch process, such as a high temperature etch or a high polymer etch, is used for etching the via hole 316 and the trench line 314 as shown in FIG. 4C.

During a high temperature etch, the substrate of the integrated circuit is heated to a high temperature. As known to one of ordinary skill in the art, the use of high temperature results in high etch selectivity because masking materials are less prone to etching at high temperatures. In contrast to the prior art which typically use temperatures in the range of 0° C. to 20° C., higher temperatures in the range of 40° C. to 200° C. may be used in the etch process of the present invention. Such use of higher temperatures results in high etch selectivity.

Furthermore, without a photoresist layer which would add depth to the via hole and the trench line, a high polymer etch may be used to etch the trench line and the via hole. A high polymer etch deposits polymer on masking materials and thus selectively etches predominantly outside of the masking materials. Thus, a high polymer etch results in high etch selectivity.

Referring to FIG. 4D, any exposed masking layers, such as any exposed nitride layers, are etched away before the via hole 316 and the trench line 314 are filled with conductive material. Note that the via hole 316 is filled with a first conductive material, and the trench line 314 is filled with a second conductive material. The first conductive material and the second conductive material may be the same type of conductive material, or alternatively, different conductive materials.

The trench masking layer 402 is aligned with the via masking layer 308 such that the trench line, defined by the trench pattern, is contiguous with the via hole, defined by the via pattern. Thus, the first conductive material filled within the via hole 316 forms a conductive path with the second conductive material filled within the trench line 314. The first conductive material and the second conductive material may be aluminum or copper, or any other conductive material known to one of ordinary skill in the art to be used for integrated circuit metallization.

Furthermore, with a damascene etch process, the surface of the integrated surface is polished after the second conductive material is deposited into the trench line 314 and onto the surface of the integrated circuit. The polishing step defines the second conductive material to be within the trench line.

Referring to FIG. 5A (with same reference numerals as FIG. 4 for elements having similar structure and function), in an alternative embodiment of the present invention, a high polymer etch is used to etch the trench line 314 with the photoresist layer 404 as the masking layer. The photoresist layer 404 is then removed as shown in FIG. 5B. Then the via hole 316 is etched using a high temperature etch or a high polymer etch for the high etch selectivity as shown in FIG. 5C. Referring to FIG. 5D, any exposed masking layers, such as any exposed nitride layers, are etched away before the via hole 316 and the trench line 314 are filled with conductive material.

Referring to FIG. 5A, by etching the trench line 314 with the photoresist layer 404, the top profile of the trench insulating layer 310 is better controlled since an extra photoresist layer 404 adds depth to the etched trench line 314. A high polymer etch for the trench line 314 also results in high etch selectivity of the trench line 314.

In addition, the via hole 316 is still etched using a high temperature etch or a high polymer etch after removal of the photoresist layer 404. Thus, the via hole 316 is etched with the high etch selectivity resulting from a high temperature etch or a high polymer etch. Furthermore, because the photoresist layer 404 is already removed and the trench line 314 is already etched out, an opening with a lower aspect ratio (with the aspect ratio defined as the depth over the width of the opening) is etched during the latter etch for just the via hole 316. As known to one for ordinary skill in the art of integrated circuit fabrication, an opening with a lower aspect ratio is easier to etch during an etching process. With fine-line metallization, lowering the aspect ratio of the opening to be etched is especially important since aspect ratios for fine-line metallization are already high.

FIG. 6A (with same reference numerals as FIG. 5 for elements having similar structure and function) shows an alternative embodiment of the present invention. In this embodiment, the high polymer etch used to etch the trench line 314 has sufficient carbon content in the etching medium such that a polymer layer 602 develops in the via opening defined by the via mask 308.

A typical etching process that is used for etching the trench line 314 is a plasma etch as known to one of ordinary skill in the art of integrated circuit fabrication. If the plasma includes a carbon fluoride compound of $C_4F_8$, the relatively high carbon to fluoride ratio of this compound results in deposition of the polymer layer 602 in the via opening defined by the via mask 308. Any plasma etching compound having a relatively high carbon content may be used for deposition of the polymer layer 602 during etching of the trench line 314.

This polymer layer 602 stops further etching of any insulating material beyond the polymer layer 602. Thus, during the high polymer etch for the trench line 314, the etching stops readily after the trench line 314 and up to the polymer layer 602. Such a deposition of the polymer layer 602 is a convenient way to stop the etching up to the via insulating layer 306.

Referring to FIG. 6B, the photoresist layer 404 and the polymer layer 602 are removed, according to means that are known to one of ordinary skill in the art of integrated circuit fabrication. Referring to FIG. 6C, the trench masking layer 402 is comprised of hard mask material. Then, the via hole 316 is etched using a high polymer etch as already described for the high etch selectivity.

Figure 6:
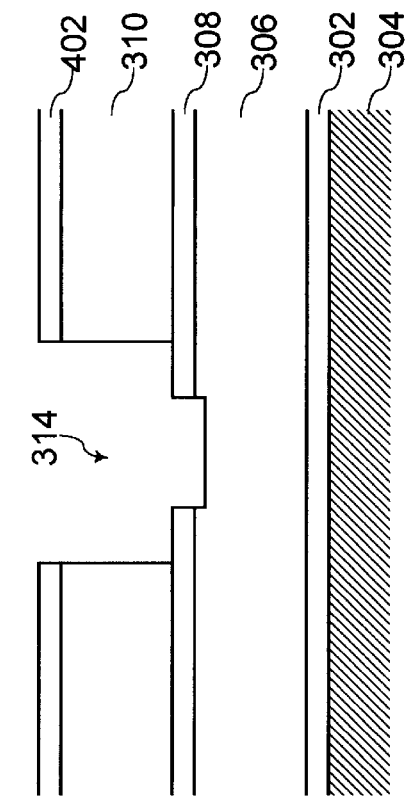
FIG. 6, including
Figure 6:
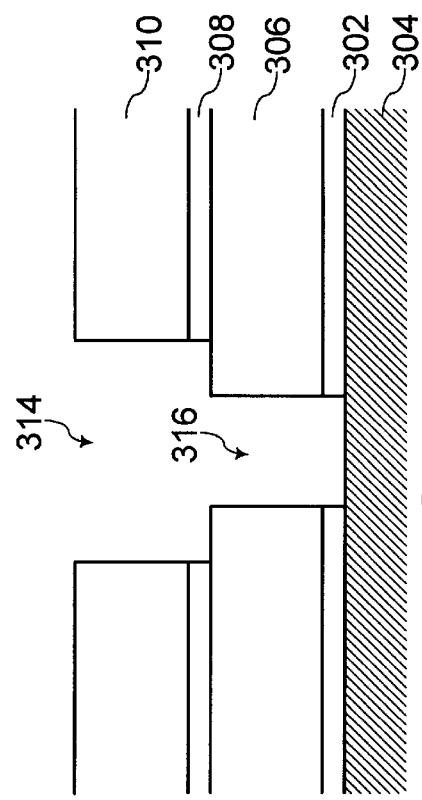
Figure 6:
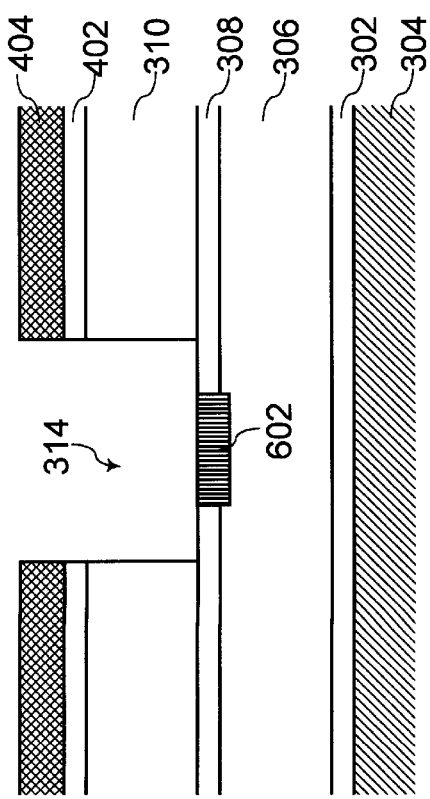
Figure 6:
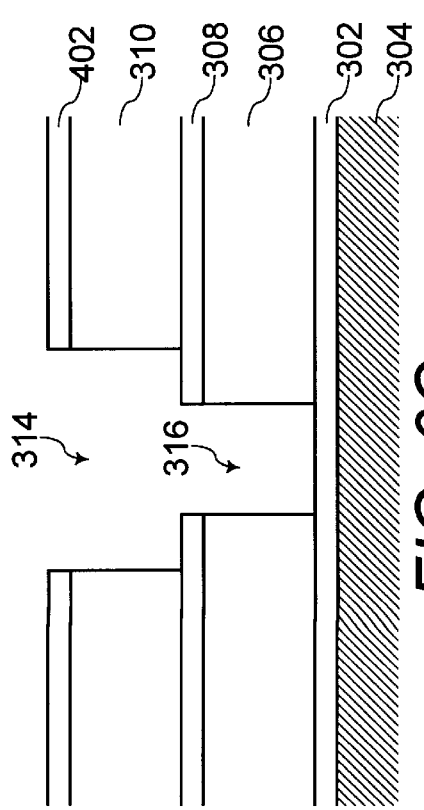

Referring to FIG. 6D, any exposed masking layers, such as any exposed nitride layers, are etched away before the via hole 316 and the trench line 314 are filled with conductive material as already described herein. FIG. 6 illustrates etching the trench line 314 and the via hole 316 using sequential high polymer etches in case other IC fabrication constraints preclude a high temperature etch. Such a sequence of high polymer etches results in a high etch selectivity without necessarily resorting to high temperatures.

In this manner, the present invention uses masking layers comprised of hard mask material during a etch process for etching openings within an integrated circuit. By using hard mask material during the etching process, a high temperature etch and/or a high polymer etch is used for higher etch selectivity. The higher etch selectivity is especially important for fine-line metallization in scaled-down integrated circuits.

The foregoing is by way of example only and is not intended to be limiting. For example, the present invention may be implemented for any other type of contiguous openings within an integrated circuit aside from just the example of a trench line and a via hole. Any type of first opening (aside from just the example of a via hole) in a first opening layer (aside from just the example of a via insulating layer) may be defined by a first pattern of a first masking layer. Any type of second opening (aside from just the example of a trench line) in a second opening layer (aside from just the example of a trench insulating layer) may be defined by a second pattern of a second masking layer. The first pattern and the second pattern would be aligned such that the first opening and the second opening are contiguous with each other. The second masking layer is comprised of hard mask material such that at least one of a high temperature etch and a high polymer etch is used for etching at least one of the first opening and the second opening.

Figure 5:
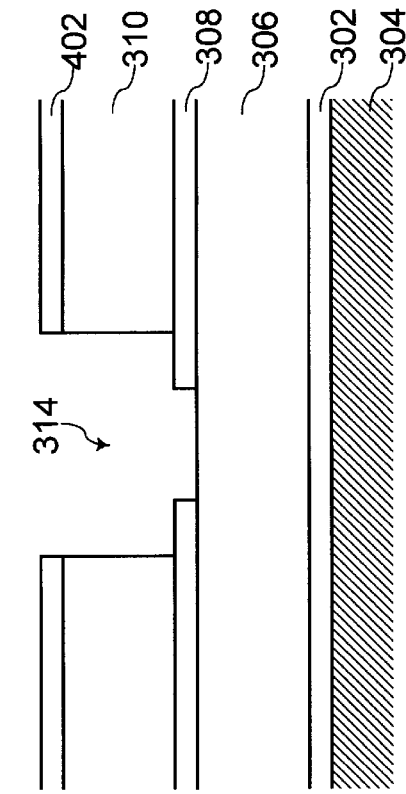
FIG. 5, including
Figure 5:
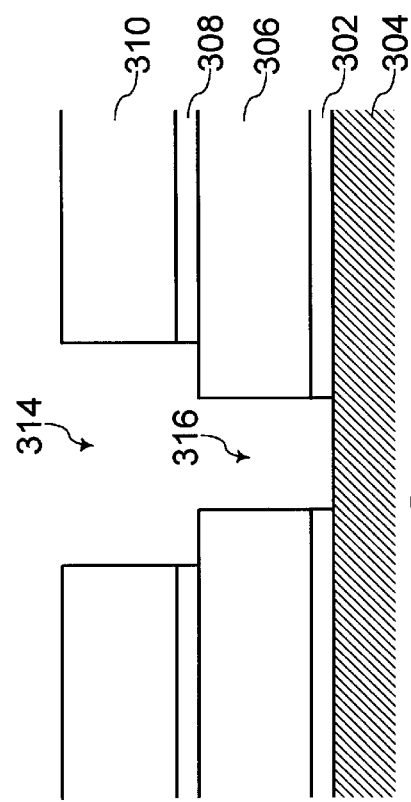
Figure 5:
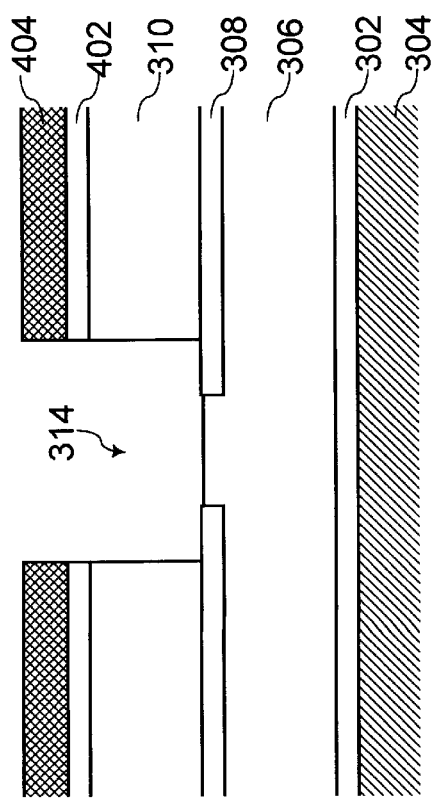
Figure 5:
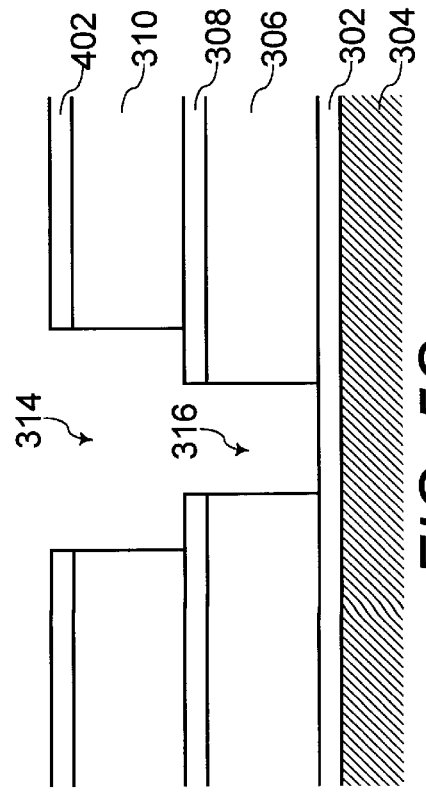

In addition, the present invention may be implemented for any number of openings within an integrated circuit. The cross-sectional examples of one trench line over one via hole in FIGS. 4–6 are shown by way of example only for clarity of illustration.

Figure 2:
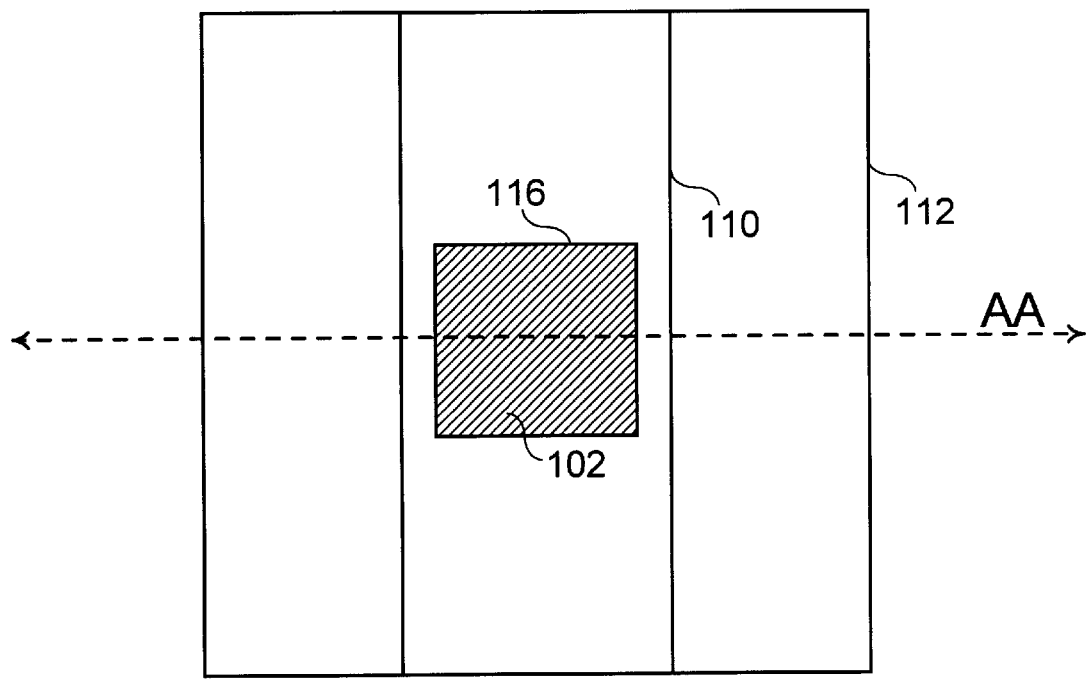
FIG. 2 shows a top view of the integrated circuit of FIG. 1.

Furthermore, the present invention may be used for any shape of openings aside from the example of FIG. 2. In addition, the present invention may be practiced for any orientations from those illustrated in FIGS. 4–6. Thus, the integrated circuit wafer holding the structures of FIGS. 4–6 may be fabricated sideways or upside down from the orientation of FIGS. 4–6.

More importantly, the present invention may be practiced with any type of etching process known to one of ordinary skill in art to be especially amenable for use when the trench masking layer 402 is comprised of hard mask material and when the photoresist layer is removed before the etching of a part of the openings.

The invention is limited only as defined in the following claims and equivalents thereof.

We claim:

1. A method for etching a plurality of contiguous openings within an integrated circuit, the method including the steps of:

depositing a first masking layer adjacent a first opening layer, wherein said first masking layer is comprised of a hard mask material;

depositing a first photoresist layer adjacent said first masking layer;

developing and etching a first pattern in said first photoresist layer for defining said first pattern having a first opening in said first opening layer;

removing said first photoresist layer from said first masking layer after said first pattern is etched in said first masking layer;

depositing a second opening layer adjacent the first masking layer;

depositing a second masking layer, that is comprised of a hard mask material, adjacent the second opening layer;

depositing a second photoresist layer adjacent said second masking layer;

developing and etching a second pattern in said second photoresist layer for defining said second pattern having a second opening in said second opening layer, wherein the second pattern is aligned with the first pattern such that the first opening and the second opening are contiguous;

removing said second photoresist layer from said second masking layer after said second pattern is etched in said second masking layer; and etching at least one of the first opening in the first insulating layer as defined by said first pattern etched in said first masking layer and the second opening in the second insulating layer as defined by said second pattern etched in said second masking layer with at least one of an etch at a temperature in a range of 40° Celsius and 200° Celsius and a high polymer etch, after removal of any photoresist, for high etch selectivity;

whereby removal of any photoresist before said step of etching at least one of the first opening and the second opening avoids reflow of photoresist during said etch at a temperature in a range of 40° Celsius and 200° Celsius;

and whereby removal of any photoresist before said step of etching at least one of the first opening and the second opening avoids deposit of polymer within said first opening and said second opening during said high polymer etch.

2. The method of claim 1, wherein the first opening is a via hole and the second opening is a trench line etched during a dual damascene etch.

3. A method for etching a via hole and a trench line within an integrated circuit during a dual damascene etch, the method including the steps of:

depositing a via masking layer adjacent a via insulating layer, wherein said via masking layer is comprised of a hard mask material;

depositing a first photoresist layer adjacent said via masking layer;

developing and etching a via pattern in said first photoresist layer for defining said via pattern having a via hole in said via insulating layer;

removing said first photoresist layer from said via masking layer after said via pattern is etched in said via masking layer;

depositing a trench insulating layer adjacent the via masking layer;

depositing a trench masking layer, that is comprised of a hard mask material, adjacent the trench insulating layer;

depositing a second photoresist layer adjacent said trench masking layer;

developing and etching a trench pattern in said second photoresist layer for defining said trench pattern having a trench line in said trench insulating layer, wherein the trench pattern is aligned with the via pattern such that the via hole and the trench line are contiguous;

removing said second photoresist layer from said trench masking layer after said trench pattern is etched in said trench masking layer; and etching at least one of the via hole in the via insulating layer as defined by said via pattern etched in said via masking layer and the trench line in the trench insulating layer as defined by said trench pattern etched in said trench masking layer with at least one of an etch at a temperature in a range of 40° Celsius and 200° Celsius and a high polymer etch after removal of any photoresist, for high etch selectivity;

whereby removal of any photoresist before said step of etching at least one of the trench line and the via hole avoids reflow of photoresist during said etch at a temperature in a range of 40° Celsius and 200° Celsius;

and whereby removal of any photoresist before said step of etching at least one of the trench line and the via hole avoids deposit of polymer within said trench line and said via hole during said high polymer etch.

4. The method of claim 3, further including the step of:

etching any part of the via masking layer and the trench masking layer that is exposed after etching the trench line and the via hole.

5. The method of claim 4, further including the steps of:

filling the via hole with a first conductive material;

filling the trench line with a second conductive material, wherein the first conductive material filled within the via hole forms a conductive path with the second conductive material filled within the trench line; and polishing the surface of the integrated circuit.

6. The method of claim 3, wherein the hard mask material is comprised of at least one of nitride, titanium nitride, and titanium.

7. A method for etching a via hole and a trench line within an integrated circuit during a dual damascene etch, the method including the steps of:

depositing a via masking layer adjacent a via insulating layer, wherein said via masking layer is comprised of a hard mask material;

depositing a first photoresist layer adjacent said via masking layer;

developing and etching a via pattern in said first photoresist layer for defining said via pattern having a via hole in said via insulating layer;

removing said first photoresist layer from said via masking layer after said via pattern is etched in said via masking layer;

depositing a trench insulating layer adjacent the via masking layer;

depositing a trench masking layer, that is comprised of a hard mask material, adjacent the trench insulating layer;

depositing a second photoresist layer adjacent said trench masking layer;

developing and etching a trench pattern in said second photoresist layer for defining said trench pattern having a trench line in said trench insulating layer, wherein the trench pattern is aligned with the via pattern such that the via hole and the trench line are contiguous;

etching the trench pattern in the trench masking layer as defined by said second photoresist layer deposited adjacent the trench masking layer;

etching the trench line within the trench insulating layer using a high polymer etch with the second photoresist layer remaining on the trench masking layer;

forming a polymer layer at the juncture of the trench line and the via hole during the high polymer etch to stop etching beyond the trench line;

removing said second photoresist layer from said trench masking layer after said trench line is etched in said trench insulating layer;

removing the polymer layer formed at the juncture of the trench line and the via hole; and etching the via hole in the via insulating layer as defined by said via pattern etched in said via masking layer with at least one of an etch at a temperature in a range of 40° Celsius and 200° Celsius and a high polymer etch after removal of any photoresist, for high etch selectivity;

whereby removal of any photoresist before said step of etching the via hole avoids reflow of photoresist during said etch at a temperature in a range of 40° Celsius and 200° Celsius;

and whereby removal of any photoresist before said step of etching the via hole avoids deposit of polymer within said via hole during said high polymer etch.

8. The method of claim 7, further including the steps of:

etching any part of the via masking layer and the trench masking layer that is exposed after etching the trench line and the via hole;

filling the via hole with a first conductive material;

filling the trench line with a second conductive material, wherein the first conductive material filled within the via hole forms a conductive path with the second conductive material filled within the via hole; and polishing the surface of the integrated circuit.

* * * * *